United States Patent
Heinz et al.

(10) Patent No.: US 6,291,929 B1
(45) Date of Patent: Sep. 18, 2001

(54) PIEZOELECTRIC ACTUATOR

(75) Inventors: Rudolf Heinz, Renningen; Klaus-Peter Schmoll, Lehrensteinsfeld, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/601,727

(22) PCT Filed: Sep. 11, 1999

(86) PCT No.: PCT/DE99/02882

§ 371 Date: Aug. 25, 2000

§ 102(e) Date: Aug. 25, 2000

(87) PCT Pub. No.: WO00/35027

PCT Pub. Date: Jun. 15, 2000

(30) Foreign Application Priority Data

Dec. 5, 1998 (DE) .............................. 198 56 201

(51) Int. Cl.⁷ .................................... H01L 41/08
(52) U.S. Cl. ............................. 310/328; 310/366
(58) Field of Search ..................... 310/328, 366

(56) References Cited

U.S. PATENT DOCUMENTS 4,633,120 * 12/1986 Sato et al. ...................... 310/328
5,237,239 * 8/1993 Inioe et al. ..................... 310/328
5,266,862 * 11/1993 Ohya ............................ 310/328
5,438,232 * 8/1995 Inioe et al. .................... 310/328

\* cited by examiner

Primary Examiner—Mark O. Budd
(74) Attorney, Agent, or Firm—Ronald E. Greigg; Edwin E. Greigg

(57) ABSTRACT

The invention relates to a piezoelectric actuator, in particular for actuating control valves or injection valves in internal combustion engines of motor vehicles, having a piezoelectric actuator body in the form of a multi-layer laminate of stacked layers of piezoelectric material and metal or electrically conductive layers, acting as electrodes, located between them, in which one of the face ends of the actuator body is fixed to a stationary metal actuator base, and the other face end borders a metal retaining plate that is movable with the actuator stroke. The piezoelectric actuator is characterized in that the piezoelectric material has blind metal electrodes on both face ends, each of which electrodes is located in a passive piezoceramic cover layer between the respective outermost active piezoceramic layer and the movable retaining plate and actuator base.

12 Claims, 3 Drawing Sheets

PIEZOELECTRIC ACTUATOR

PRIOR ART

BACKGROUND OF THE INVENTION

The invention is directed to improvements in piezoelectric actuators, in particular for actuating control valves or injection valves in internal combustion engines in motor vehicles, having a piezoelectric actuator body, in particular in the form of a multilayer laminate of layered plies of piezoelectric material and intervening metal or electrically conductive layers acting as electrodes, these electrode layers being contacted by electrically conductive common electrode leads, and the actuator body is surrounded by a metal module wall defining an interstice therebetween that contains the common electrode leads.

One such piezoelectric actuator disclosed in German Patent Disclosure DE 196 50 900 A1 of Robert Bosch GmbH.

As is well known, piezoelectric actuators can for instance be used for injection valves of a vehicle motor and in brake systems with anti-lock and traction control systems.

Such injection valves equipped with piezoelectric actuators have an injection nozzle controlled by a tappetlike closure device. An operative face toward the nozzle is disposed on the tappet and is acted upon by the pressure of the fuel supplied to the nozzle; the pressure forces seek to urge the tappet in the opening direction of the closure device. The tappet protrudes with a plungerlike end, whose cross section is larger than the aforementioned operative face, into a control chamber. The pressure effective there seeks to urge the tappet in the closing direction of the closure device. The control chamber communicates with the fuel supply, which is at a high pressure, via an inlet throttle and with a fuel return line that has only low pressure, via an outlet valve that is throttled as a rule or is combined with an outlet throttle. When the outlet valve is closed, a high pressure prevails in the control chamber, by which the tappet is moved in the closing direction of the closure device, counter to the pressure on its operative face toward the nozzle, or is kept in the closing position. Upon opening of the outlet valve, the pressure in the control chamber drops; the magnitude of the drop in pressure is determined by the size of the inlet throttle and by the throttle resistance of the opened outlet valve, or the outlet throttle combined with it. As a result, the pressure in the control chamber decreases when the outlet valve is opened, in such a way that the tappet is moved in the opening direction of the closure device, or held in the open position, by the pressure forces that are operative on its operative face toward the nozzle.

In comparison with electromagnetically actuated injection valves, piezoelectric actuators can switch faster. However, in the design of a piezoelectric actuator, it must be noted that internal losses in the piezoelectric body of the actuator cause lost heat, which has to be dissipated so that the actuator will not overheat. Since the ceramic materials of the piezoelectric ceramic have poorer heat conductivity, the dissipation inside the actuator body, which substantially comprises ceramic material, is unfavorable, especially in long actuators, whose length is greater than their width.

Because of the electrodes that are located in the active part of the actuator body, its heat conductivity crosswise to the electrode layers is higher by a factor of three to five than at right angles to this, since the piezoelectric ceramic material is a poor heat conductor. Naturally, this factor depends on the geometric conditions, such as the thickness of is the ceramic layers, the thickness of the electrode layers, and on the thickness of the non-continuous electrode from the edge of the actuator body. Since the convection, that is, the output of heat to the air, is poor, the greatest part of the heat must be dissipated via the end faces. Since the thermal conduction, as noted, is poor perpendicular to the electrode layers, the heat takes the following course, in simplified terms. It is guided by the internal electrodes of the active part of the actuator body to the outer electrodes. There, it is distributed relatively well and thus quickly reaches the vicinity of the face ends of the actuator body. Since the outer electrodes have no contact with the metal actuator base or the metal retaining plate in the region of the actuator head, the heat has to flow via the poorly conducting face ends of the actuator body. Since the outer electrodes are located on the outside, the heat also flows to the end face only in the outer regions of the actuator body.

Cooling the actuator with a liquid coolant, such as fuel, water, motor oil and the like, which is theoretically possible, is unfavorable, first because of the risk of a short circuit from the water component that is contained both in the fuel and in motor oil, and second because the actuator module is more expensive because of complicated seals, which must preclude the coolant used from escaping from the actuator module, especially when the actuator becomes heated.

OBJECT OF THE INVENTION

It is therefore the object of the invention to make a piezoelectric actuator possible in such a way that reliable cooling of the actuator body, which heats up during operation, is possible without using a liquid coolant, and that the piezoelectric actuator can be mounted simply and needs no special seals as in the case of liquid cooling.

SUMMARY OF THE INVENTION

To attain this object, a piezoelectric actuator according to the invention is characterized, in that the piezoelectric material has blind metal electrodes on both face ends, each of which electrodes is located in a passive piezoceramic cover layer between the respective outermost active piezoceramic layer and the movable retaining plate and actuator base.

The term "blind electrode" in this case means that these electrodes, introduced on the face ends of the actuator body to dissipate the actuator body heat, do not extend to the edge to any side. Thus they have no metal-to-metal contact with the outer electrodes, and in other words the electrical properties remain unchanged.

For heat dissipation, this has the following effect. Once the short edge spacing between the outer electrode and the blind electrode or electrodes has been overcome, the heat can easily penetrate from the outside inward, and can then take the last remainder of the dissipation path, utilizing the entire end face of the actuator, until reaching the metal actuator base and the movable metal retaining plate. The heat dissipation can thus be improved through the bottleneck at the face ends of the actuator body and can reduce the maximum thermal load on the actuator.

In a preferred embodiment, the piezoelectric actuator is designed in such a way that a plurality of parallel blind electrodes are located, spaced apart from one another, in each of the passive cover layers of the actuator body.

In a multi-layer actuator of this kind, the layer thickness of the piezoelectric material is 0.1 mm, for instance. In that case, fourteen blind electrodes, for instance, can be spaced apart by 0.1 mm in an upper and lower cover layer whose height is approximately 1.5 mm.

Here it is assumed that the layer structure in the cover layers conforms to that of the active region of the actuator body in terms of the layer thickness.

This kind of layer structure of the actuator body with an identical layer thickness is preferred from the standpoint of economical manufacture of the actuator body. However, it is not absolutely necessary for the invention. The layer thickness in the active region can differ from that in the cover regions. Furthermore, a greater or lesser number of blind electrodes can be provided in the lower cover layer compared to the upper cover layer.

The above and additional advantageous characteristics of the piezoelectric actuator according to the invention will be described in further detail below in conjunction with the drawings.

DETAILED DESCRIPTION OF PREFERRED EMBODIMENTS

Figure 1:
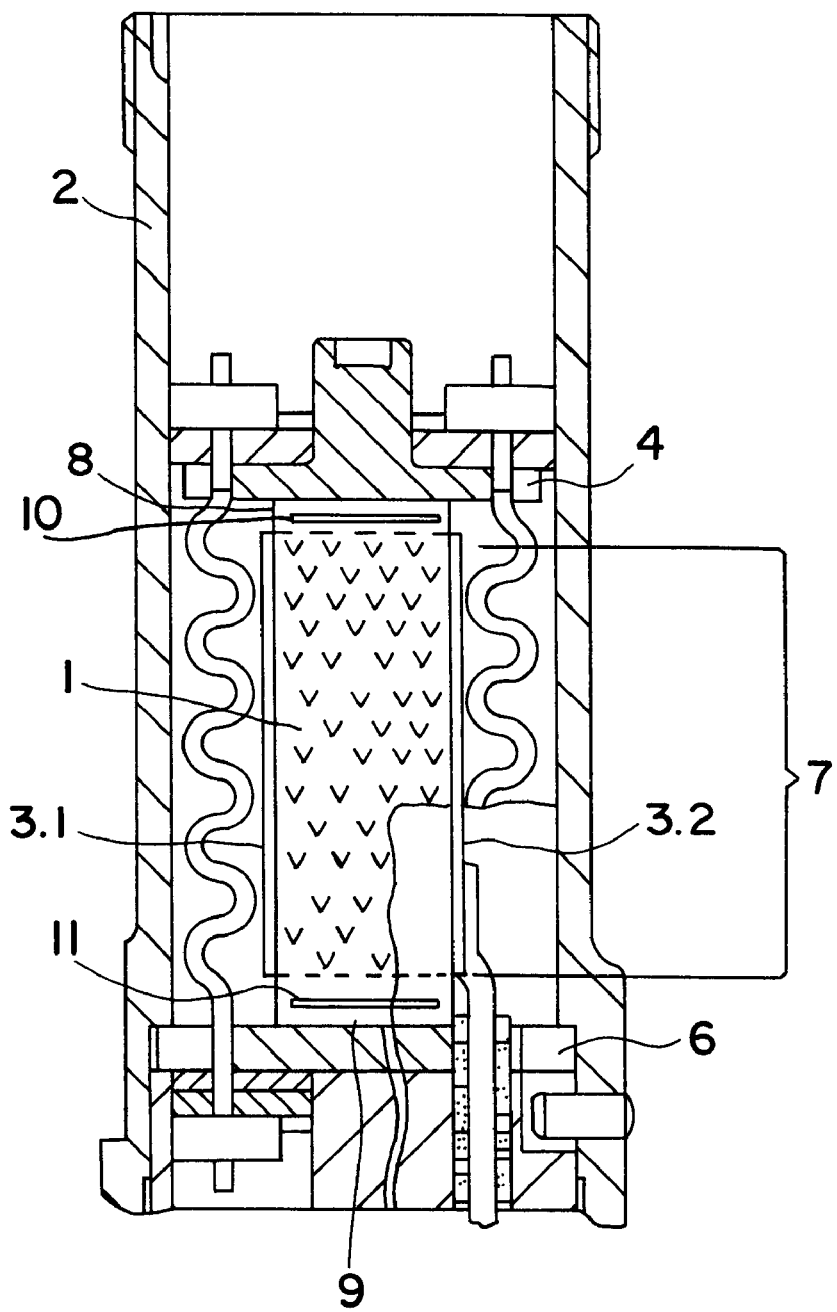
FIG. 1 in longitudinal section shows part of a piezoelectric actuator module, whose actuator body has blind electrodes in its upper and lower cover layer.

In the portion of a piezoelectric actuator of the invention, shown in longitudinal section in FIG. 1, an actuator body 1, which has the form of a multi-layer laminate of stacked layers of piezoelectric material and between them metal or electrically conductive layers acting as electrodes, is elastically prestressed with its face ends by spring bands (not shown) between an upper, stationary metal actuator base 6 and an upper, axially movable metal retaining plate 4 that rests on the actuator head. The actuator body 1 is enclosed by a metal actuator wall 2. The terms "lower" and "upper" refer to the position of the actuator in the drawing.

If the actuator 1 is acted upon by a pulsating electrical voltage at its electrodes, then it executes similarly pulsating strokes, thereby changing the spacing between its face ends that are fastened between the upper, movable retaining plate 4 and the lower, fixed actuator base 6 by the spring bands. These strokes are transmitted from the movable retaining plate 4 to the needle (not shown) of a valve via a piston (also not shown). It should also be noted that the common outer electrodes 3.1 and 3.2 that conduct the electrical voltage to the active electrodes of the actuator body laterally cover the entire length of the active region 7.

The active region 7 is bounded at the top and bottom by a passive cover layer 8 and 9, respectively. These passive cover layers 8 and 9 serve first to protect and electrically insulate and demarcate the active region 7 of the actuator body 1 from the metal retaining plate 4 and the also-metal actuator base 6.

Figure 2:
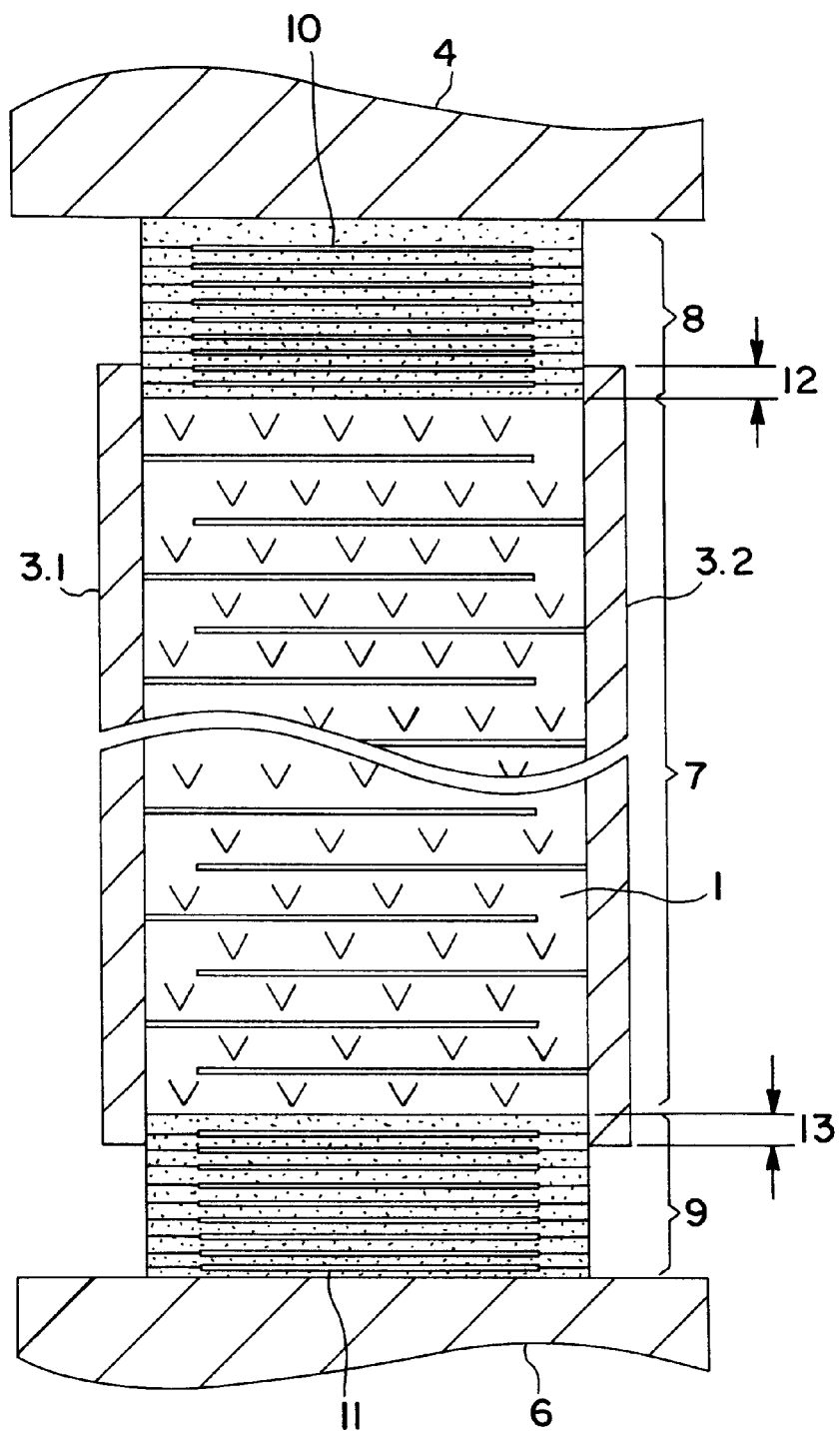
FIG. 2, in an enlarged view, shows a preferred embodiment of the piezoelectric actuator of the invention, with a plurality of parallel blind electrodes in the upper and lower cover layer.

Although this is not made clear in FIG. 1, the common outer electrodes 3.1 and 3.2 should protrude somewhat into the region of the cover layers 8 and 9, as indicated in FIG. 2 by overlap zones 12 and 13. However, they must not touch either the upper metal retaining plate 4 or the actuator base 6, because otherwise an electrical short circuit would occur.

According to the invention, blind electrodes 10, 11 are incorporated into the cover layers 8 and 9. In this case, "blind" means that the electrodes do not extend as far as the edge toward any side. Thus they have no metal-to-metal contact with the common outer electrodes 3.1 and 3.2; in other words, the electrical properties remain unchanged.

For the heat dissipation, this has the following effect. Once the short edge spacing between the outer electrodes 3.1 and 3.2 and the blind electrodes 10, 11 has been overcome, the heat can easily penetrate from the outside, that is, from the outer electrodes 3.1, 3.2 and the outer layers of the actuator body, inward and then cover the final remainder of the course, over the full width of the actuator, as far as the movable upper retaining plate 4 and at the bottom toward the stationary metal actuator base 6.

In FIG. 1, only one blind electrode 10, 11 is shown in each cover layer 8, 9, respectively.

FIG. 2, conversely, shows a preferred embodiment of a piezoelectric actuator, in which both in the upper cover layer 8 and in the lower cover layer 9, the plurality of blind electrodes 10, 11 that adjoin the active region 7 to the top and bottom are parallel to one another and spaced apart from one another. The spacing of the blind electrodes 10, 11 in the preferred embodiment is defined by the thickness of the passive piezoceramic layers that form the cover layers 8, 9.

The layer thickness of the passive piezoceramic layers in a realistic embodiment is 0.1 mm, for instance. In that case, if the upper and lower cover layers 8, 9 are 1.5 mm thick, fourteen blind electrodes 10, 11 can be accommodated in them.

To make it clear that the layer thickness of the piezoelectric layers in the active region 7 of the actuator body 1 need not necessarily match the layer thickness in the cover layers 8, 9, these are shown differently in FIG. 2. In a real case, however, for the sake of economical manufacture of a multi-layer actuator, the layer thickness in the active region will be identical to that in the cover layers 8, 9.

Figure 3A:
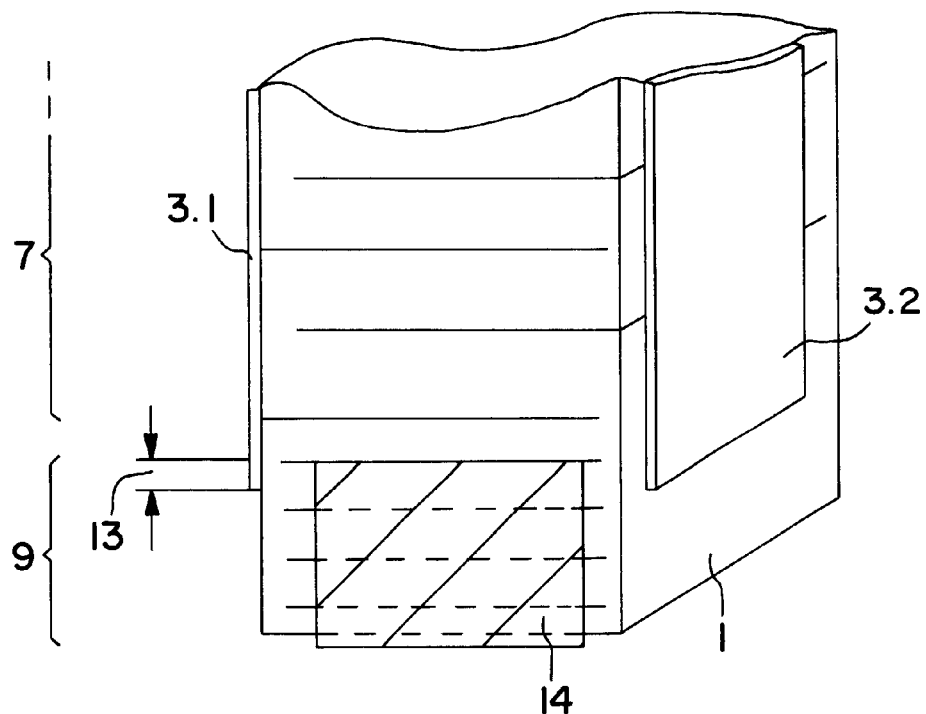
FIG. 3 shows a variant of the embodiment shown in FIG. 2.
Figure 3B:
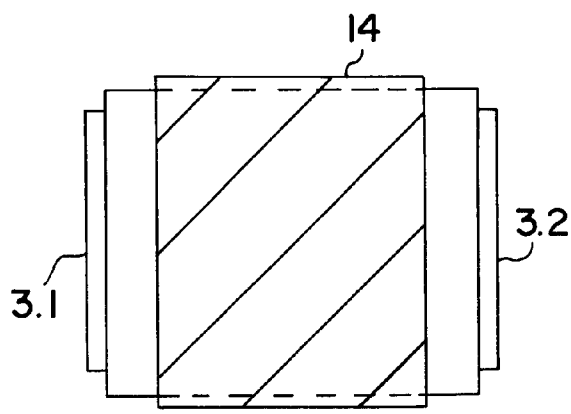

FIG. 3 shows an advantageous variant of the embodiment shown in FIG. 2, in which an electrically conductive layer 14 is located in the region of the passive zones or cover layers 8, 9 and short-circuits the blind electrodes 10, 11, thus enhancing the heat dissipation.

Piezoelectric actuators that are designed according to the invention can be employed in common rail Diesel injector systems and in PDE injector systems. Gasoline direct-injection valves with piezoelectric actuators of this kind can advantageously be achieved as well.

The foregoing relates to a preferred exemplary of embodiments of the invention, it being understood that other variants and embodiments thereof are possible within the spirit and scope of the invention, the latter being defined by the appended claims.

What is claimed is:

1. A piezoelectric actuator for actuating control valves or injection valves in internal combustion engines of motor vehicles, having a piezoelectric actuator body (1) in the form of a multi-layer laminate of stacked layers of piezoelectric material and electrically conductive layers, acting as electrodes, located between them, said actuator body having face ends in which one face end is fixed to a stationary metal actuator base (6), the other face end borders a metal retaining plate (4) that is movable with an actuator stroke, and the piezoelectric material has blind metal electrodes (10, 11) on both face ends, each of which blind metal electrodes is located in a passive piezoceramic cover layer (8, 9) defined between the respective outermost active piezoceramic layer and either the movable retaining plate (4) on the one hand or the actuator base (6) on the other hand.

2. The piezoelectric actuator of claim 1, in which a plurality of parallel blind electrodes (101–110, 111–119) are provided, in each passive cover layer, spaced apart from one another.

3. The piezoelectric actuator of claim 2, in which the spacings of the blind electrodes are uniform.

4. The piezoelectric actuator of claim 2, in which the mutual spacing of the blind electrodes is equal to the electrode spacing in the active region.

5. The piezoelectric actuator of claim 2, in which the mutual spacing of the blind electrodes is less than the electrode spacing in the active region.

6. The piezoelectric actuator of claim 3, in which the mutual spacing of the blind electrodes is equal to the electrode spacing in the active region.

7. The piezoelectric actuator of claim 3, in which the mutual spacing of the blind electrodes is equal to the electrode spacing in the active region.

8. The piezoelectric actuator of claim 1, in which common electrodes (3.1 and 3.2) for connecting the active electrodes are disclosed beyond a full length of the active region (7) of the actuator body, so as to create at the top and bottom of the active region, a region of overlap (12, 13) with the passive cover layers (8, 9).

9. The piezoelectric actuator of claim 2, in which common electrodes (3.1 and 3.2) for connecting the active electrodes are disclosed beyond a full length of the active region (7) of the actuator body, so as to create at the top and bottom of the active region, a region of overlap (12, 13) with the passive cover layers (8, 9).

10. The piezoelectric actuator of claim 3, in which common electrodes (3.1 and 3.2) for connecting the active electrodes are disclosed beyond a full length of the active region (7) of the actuator body, so as to create at the top and bottom of the active region, a region of overlap (12, 13) with the passive cover layers (8, 9).

11. The piezoelectric actuator of claim 4, in which common electrodes (3.1 and 3.2) for connecting the active electrodes are disclosed beyond a full length of the active region (7) of the actuator body, so as to create at the top and bottom of the active region, a region of overlap (12, 13) with the passive cover layers (8, 9).

12. The piezoelectric actuator of claim 5, in which common electrodes (3.1 and 3.2) for connecting the active electrodes are disclosed beyond a full length of the active region (7) of the actuator body, so as to create at the top and bottom of the active region, a region of overlap (12, 13) with the passive cover layers (8, 9).

* * * * *